United States Patent [19]

Babich et al.

[11] Patent Number: 4,693,960
[45] Date of Patent: Sep. 15, 1987

[54] PHOTOLITHOGRAPHIC ETCHING PROCESS USING ORGANOSILICON POLYMER COMPOSITION

[75] Inventors: Edward D. Babich, Ridgefield, Conn.; Michael Hatzakis, Chappaqua, N.Y.; John J. Liutkis, Yorktown Heights, N.Y.; Juri R. Parasczak, Pleasantville, N.Y.; Jane M. Shaw, Ridgefield, Conn.

[73] Assignee: International Business Machines Corporation, Armonk, N.Y.

[21] Appl. No.: 928,680

[22] Filed: Nov. 7, 1986

Related U.S. Application Data

[62] Division of Ser. No. 717,987, Mar. 29, 1985, abandoned.

[51] Int. Cl.$^4$ .............................................. G03C 5/00
[52] U.S. Cl. ............................. 430/323; 430/5; 430/281; 430/312; 430/314; 430/325; 430/918; 528/32; 522/99
[58] Field of Search ............... 430/281, 325, 5, 272, 430/312, 314, 323, 918; 528/32; 522/99

[56] References Cited

U.S. PATENT DOCUMENTS

| | | | |
|---|---|---|---|
| 3,696,068 | 10/1972 | Creamer | 260/29.1 B |
| 4,052,529 | 10/1977 | Bokerman et al. | 428/537 |
| 4,208,471 | 6/1980 | Bresak et al. | 428/447 |
| 4,491,508 | 1/1985 | Olson et al. | 428/412 |
| 4,539,357 | 9/1985 | Bobear | 524/267 |

Primary Examiner—Jack P. Brammer
Attorney, Agent, or Firm—Pollock, Vande Sande & Priddy

[57] ABSTRACT

A composition containing a polysiloxane having a polymerizable ethylenically unsaturated group, and 2,2-dimethoxy-2-phenyl acetophenone as an ultraviolet light sensitizer; and use thereof in lithography.

10 Claims, 2 Drawing Figures

ETCH RATE OF VARIOUS POLYMERS IN OXYGEN

PHOTOLITHOGRAPHIC ETCHING PROCESS USING ORGANOSILICON POLYMER COMPOSITION

This application is a division of Ser. No. 717,987 filed Mar. 29, 1985 now abandoned.

TECHNICAL FIELD

The present invention is concerned with organosilicon polymer compositions and especially organosilicon polymer compositions which are capable of being imaged upon imagewise exposure to ultraviolet light radiation. In addition, the present invention is concerned with the use of the organosilicon polymer compositions in lithography. The compositions of the present invention are especially useful in integrated circuit manufacture.

BACKGROUND ART

In the manufacture of patterned devices, such as semiconductor chips and chip carriers, the steps of etching different layers which constitute the finished product are among the most critical and crucial steps involved. One method widely employed for etching is to overlay the surface to be etched with a suitable mask and then to immerse the substrate and mask in a chemical solution which attacks the surface to be etched, while leaving the mask intact. These wet chemical processes suffer from the difficulty of achieving well-defined edges on the etched surfaces. This is due to the chemicals undercutting the mask, such as by chemical seeping under the mask and, thereby, continuing to attack the surface to be etched (isotropic etching), even under portions of the mask area. Such wet etching processes are also undesirable because of the environmental and safety concerns associated therewith.

Accordingly, various so-called "dry processes" have been suggested in the hope of improving the process from an environmental viewpoint, as well as reducing the relative cost of the etching. Moreover, the so-called "dry processes" have the potential advantage of greater process control and higher aspect ratio images.

Such "dry processes" generally involve passing a gas through a container and creating a plasma in this gas. The species in this plasma are then used to etch a substrate placed in the chamber or container. Typical examples of such "dry processes" are plasma etching, sputter etching, and reactive ion etching. Reactive ion etching provides well-defined, vertically etched sidewalls. A particular reactive ion etching process is disclosed, for example, in U.S. Pat. No. 4,283,249 to Ephrath, disclosure of which is incorporated herein by reference.

One problem associated with "dry processing" techniques is providing a patternable material which is sensitive to imaging radiation while, at the same time, being sufficiently resistant to the dry-etching environment. In many instances, resistance to the dry-etching, such as to the plasma etching active species, results in erosion of the mask material and loss of resolution of the material employed for preparing the mask in the lithographic exposure to the imaging radiation.

There have been suggestions that certain siloxanes, when imaged with deep U.V. at about 2537 angstroms (see Shaw, et al., "Organo Silicon Polymers for Lithographic Applications", *Polymer Engineering and Science*, December 1983, Vol. 23, No. 18, pp. 1054–1058) act as an etch mask for an underlying polymer layer in oxygen plasma. However, such compositions are not sufficiently sensitive to the ultraviolet light radiation for practical use in thin-film, high resolution imaging. In addition, even upon the addition of dicumyl peroxide as a sensitizer, such polysiloxane compositions are still not sufficiently sensitive or thermally stable for thin-film, high resolution imaging.

Also, there have been suggestions that certain siloxanes, when imaged with electron beam (see Hatzakis, et al., "Processing Microcircuit Engineering", Lausanne, p. 396, September 1981) act as an etch mask for an underlying polymer layer in an oxygen plasma. Moreover, there have been other suggestions of use of siloxanes as reactive ion etch barriers. Along these lines, see Fried, et al., IBM *Journal Research Development*, Vol. 26, No. 3, pp. 362–371. Also, certain siloxanes have been suggested as E-beam sensitive resists. For instance, see Roberts, *Journal of Electrochemical Society*, Vol. 120, p. 1716, 1973; Roberts, Philips Technical Review, Vol. 35, pp. 41–52, 1975; and Gazard, et al., Applied Polymer Symposium, No. 23, pp. 106–107, 1974.

DISCLOSURE OF INVENTION

The present invention provides compositions which are resistant to "dry processing" techniques and especially to reactive ion etching in oxygen plasma while, at the same time, capable of providing high resolution images. The compositions of the present invention are highly sensitive to ultraviolet light radiation and in the preferred aspects are highly sensitive to deep ultraviolet irradiation ($\leq 3000$ angstroms). Moreover, the compositions of the present invention are thermally stable and relatively inexpensive. Compositions of the present invention, after irradiation, are stable at a temperature of at least about 500° C.

The compositions of the present invention provide negative resist materials. A negative resist material is one which is capable of polymerizing and/or insolubilizing upon exposure to the imaging irradiation.

The present invention is concerned with a composition which is sensitive to ultraviolet light irradiation. Compositions of the present invention comprise a polysiloxane having polymerizable ethylenically unsaturated groups, and as a sensitizer, 2,2-dimethoxy-2-phenyl acetophenone. The 2,2-dimethoxy-2-phenyl acetophenone is present in amounts in the composition sufficient to improve sensitivity of the composition to ultraviolet light irradiation.

The present invention is also concerned with a process for curing the above-defined composition by subjecting the composition to ultraviolet light irradiation. Moreover, the present invention is concerned with a process for producing an image which comprises providing on a substrate a composition of the type discussed hereinabove, imagewise exposing the composition to imaging radiation in a desired pattern, and developing the layer, thereby leaving the desired pattern remaining on the substrate.

BEST AND VARIOUS MODES FOR CARRYING OUT INVENTION

Figure 1:
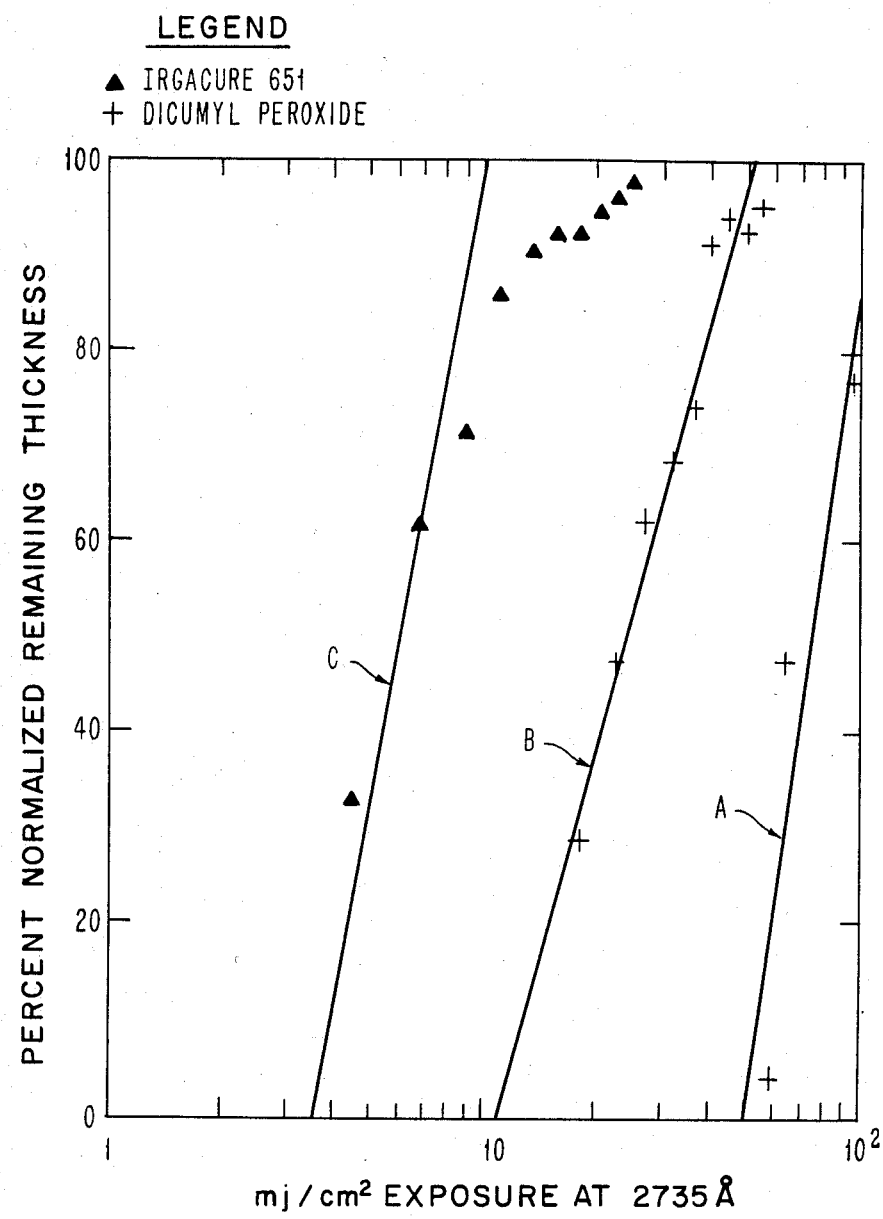
FIG. 1 is a graph illustrating relative contrast and sensitivity.

The polysiloxanes employed in accordance with the present invention contain polymerizable ethylenically unsaturated groups. These groups are preferably pendant groups at or near the end of the polymer chain and react upon exposure to the ultraviolet light irradiation to cause further polymerization of the polymers and/or cross-linking to, thereby, result in a insolubilized material. The polymers generally contain about 0.1% to about 20% and preferably about 0.1% to about 0.5% by weight of the ethylenically unsaturated groups per molecule.

In addition, in the preferred aspects of the present invention, the polysiloxane also includes phenyl or substituted phenyl, such as alky substituted phenyl groups, to provide a deep ultraviolet light sensitive composition.

In addition, the polysiloxanes employed are preferably gums having molecular weights from about $10^5$ to about $10^6$ and preferably about $5 \times 10^5$ to about $10^6$.

Examples of some suitable polysiloxanes employed in accordance with the present invention can be represented by the following polymers having the following repeating units:

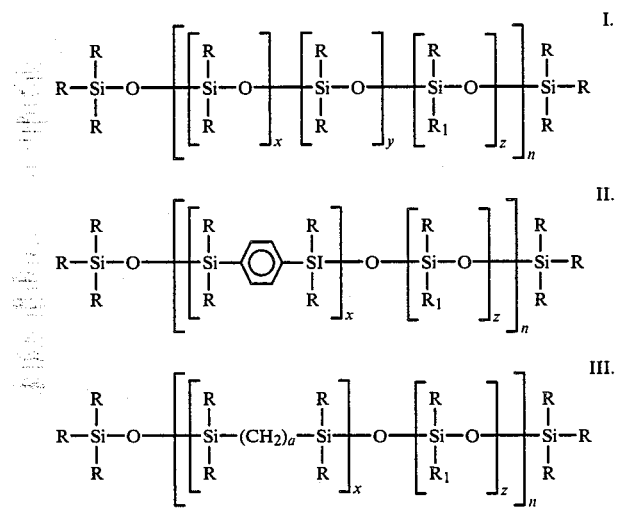

wherein x and y are integers from 0 to $10^3$ and preferably 0 to about $10^2$, and z is an integer from 1 to about $10^3$ and preferably 1 to about $10^2$, n is an integer of 1 to about $10^4$ and preferably 1 to abut $10^3$, and a is an integer from 1 to 10 and preferably from 1 to 3.

The R radicals in the above formula are well-known and are typified by radicals usually associated with silicon-bonded organic groups and silicon-bonded hydrogen groups. Each R radical in the above formula is individually selected from the group of hydrogen, monovalent hydrocarbon radicals, halogenated monovalent hydrocarbon radicals, epoxy groups, mercapto radicals, and cyanoalkyl radicals. Thus, the radical R may be alkyl, such as methyl, ethyl, propyl, butyl, and octyl; aryl radicals, such as phenyl, tolyl, xylyl, and naphthyl radicals; aralkyl radicals, such as benzyl and phenylethyl radicals; ethylenically unsaturated monovalent hydrocarbon radicals, such as vinyl, allyl, and cyclohexenyl radicals; cycloalkyl radicals, such as cyclohexyl and cycloheptyl; halogenated monovalent hydrocarbon radicals, such as dichloropropyl, 1,1,1-trifluoropropyl, chlorophenyl, dibromophenyl, and chloromethyl; cyanoalkyl radicals, such as cyanoethyl and cyanopropyl. Preferably, the radicals represented by R have less than 8 carbon atoms and, in particular, it is preferred that R be methyl, ethyl, or phenyl.

$R_1$ is an ethylenically unsaturated radical and includes vinyl and allyl. The vinyl groups can be monovalent hydrocarbon radicals, such as $CH=CH_2$, or can contain other substituents, such as oxygen and include such groups as:

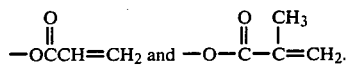

Of course, mixtures of polymers can be employed, if desired.

Also, copolymers of siloxanes with monomers and/or polymers of non-siloxane materials such as carborane can be employed, if desired.

Some suitable commercially available polysiloxanes employed in accordance with the present invention are polydimethyl-diphenyl vinyl siloxanes, such as SE-54 from the General Electric Company and PS-264 from Petrarch Systems, Inc.

These polymers can be represented by the following formula:

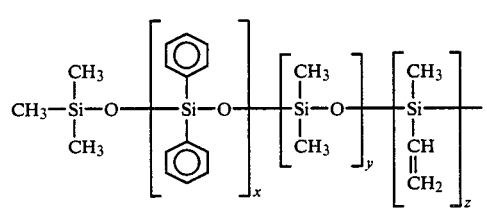

According to the manufacturer, SE-54 has a molecular weight of about 790,000 and a dispersivity of about 3. PS-264, according to the manufacturer, has a molecular weight of about 580,000 and a dispersivity of about 3.1. Dispersivity is molecular weight range. PS-264 contains about 3% to about 7% diphenyl groups and about 0.5% to about 1% by weight of methyl vinyl siloxane groups. Other suitable, commercially available polysiloxanes include PS-255, from Petrarch, which is a poly(dimethyl siloxane) (methyl vinyl siloxane) containing about 0.5% to about 1.5% by weight of methyl vinyl siloxane groups and poly (methyl-3,3,3-trifluoropropyl) (methyl vinyl siloxane) at about 1% to about 2% by weight of methyl vinyl siloxane groups, and PS-097, from Petrarch, which is a poly(dimethyl siloxane) (methyl vinyl siloxane) m-carborane copolymer.

The compositions of the present invention also contain 2,2-dimethoxy-2-phenyl acetophenone in order to render the compositions sensitive to ultraviolet irradiation to the degree desired in accordance with the present invention.

Usually, the composition contains at least about 0.1% by weight to 2,2-dimethoxy-2-phenyl acetophenone, based upon the weight of the polypreoxane in the composition.

Preferably, the compositions contain about 1% to about 20% by weight and more preferably about 5% to about 15% by weight of the 2,2-dimethoxy-2-phenyl acetophenone based upon the weight of the polysiloxane in the composition. That the 2,2-dimethoxy-2-phenyl acetophenone provided the composition with the high degree of sensitivity achieved in accordance with the present invention, along with the retention of thermal stability was quite surprising in that a number of organic sensitizers were tested and only two (i.e., dicumyl peroxide and 2,2-dimethoxy-2-phenyl acetophenone) were found to be compatible or soluble in the polysiloxane. However, as demonstrated in FIG. 1, the sensitizer employed in accordance with the present invention provided significantly improved sensitivity as compared to the use of equivalent amounts of dicumyl peroxide and further, as compared to the polysiloxane, per se.

Curve A in FIG. 1 illustrates the exposure required for the polysiloxane without any sensitizer or initiator. Curve B illustrates the polysiloxane containing 10% by weight of dicumyl peroxide. Curve C represents the polysiloxane containing 10% by weight of the 2,2-dimethoxy-2-phenyl acetophenone (commercially available under the trade designation "Irgacure 651").

As apparent from FIG. 1, the sensitizer employed in accordance with the present invention provides a film at least about ten times more sensitive to the ultraviolet light radiation than the polysiloxane alone, and at least about five times more sensitive to the ultraviolet light irradiation than the composition containing the polysiloxane and 10% by weight of dicumyl peroxide.

The data is obtained by exposing the polymer films indicated above to deep UV radiation of 2537 angstroms and measuring the thickness remaining as a function of exposure dosage. The increase in sensitivity results in decrease in exposure time on lithography tools.

The polysiloxane compositions of the present invention should provide sufficient absorption of ultraviolet light so that the irradiation which is incident upon it will be adequately absorbed throughout a film to thereby cause cross-linking or polymerization.

It is preferred that the polysiloxanes employed in accordance with the present invention contain ethylenically unsaturated pendent groups, rather than end groups in order to provide better cross-linking density and increased thermal stability.

Moreover, the polysiloxane compositions of the present invention can be admixed with conventional additives, such as fillers, plasticizers, and diluents.

When used as a lithographic material, the polysiloxanes compositions of the present invention are applied to a desired substrate to provide films, generally about 1500 angstroms to about 1 mil thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for difusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and, especially, multilayer ceramic devices. Also included are dielectric substrates which can be thermoplastic and/or thermosetting polymers. Typical thermosetting polymeric materials include epoxy, phenolic-based materials, polyamides, and polyimides. The dielectric materials may be molded articles of the polymeric materials containing fillers and/or reinforcing agents, such as glass-filled epoxy or phenolic-based materials. Examples of some phenolic-type materials include copolymers of phenol, resorcinol, and cresol. Examples of some suitable thermoplastic polymeric materials include polyolefins, such as polypropylene; polysulfones; polycarbonates; nitrile rubber; and ABS polymers.

Figure 2:
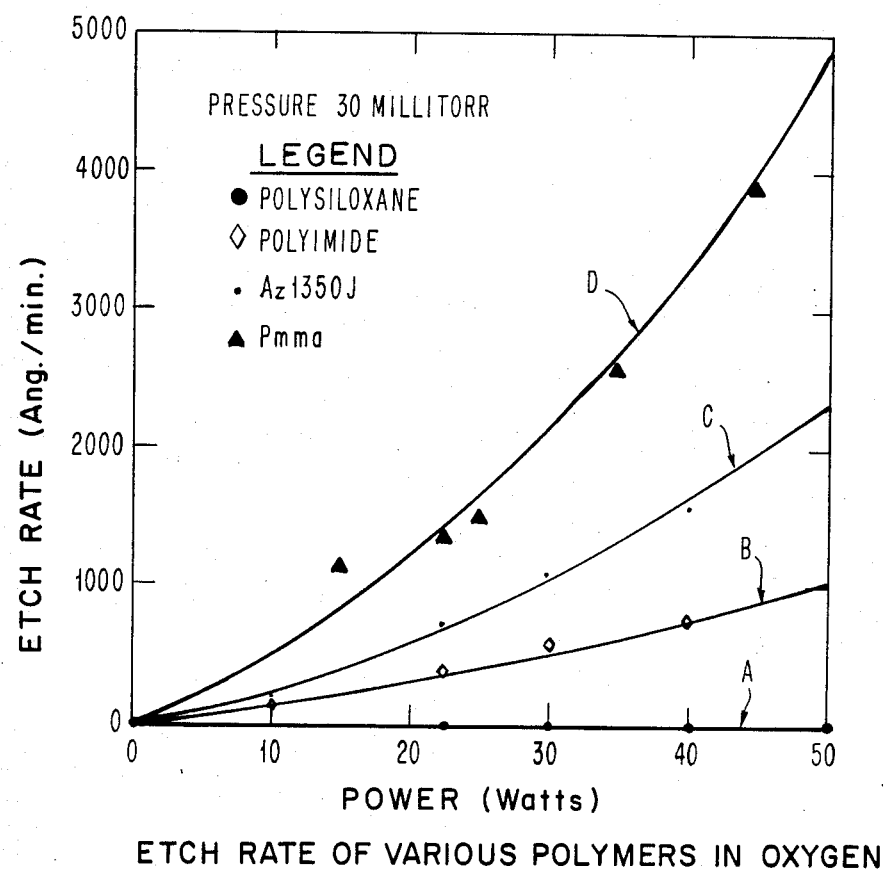
FIG. 2 is a graph illustrating relative etch rates.

The polysiloxane compositions of the present invention can be used as the top imaging layer in a double layer resist system for the oxygen plasma etching of an underlying planarizing polymer layer since the compositions of the present invention are resistant to the conditions of the plasma etching. For instance, the etch rate ratio in oxygen plasma at 30 millitorr for a diazoketone-sensitized phenol-formaldehyde novolak to the compositions of the present invention is about 100:1. See FIG. 2 which graphically illustrates the relative etch rates in oxygen plasma of various compositions. Curve A in FIG. 2 represents the etch rate of a polysiloxane employed in the present invention (without the acetophenone); Curve B illustrates the etch rate of a polyimide; Curve C represents the etch rate of a diazo-sensitized phenolformaldehyde (AZ 1350 J); and Curve D represents the etch rate of polymethyl methacrylate. As apparent from FIG. 2, polysiloxanes have significantly greater resistance to etching in plasma then the other polymers illustrated. The conditions of the plasma etching are about 30 millitorr pressure, and a power of 25 watts is a parallel plate reactor.

The polysiloxane compositions of the present invention, when used in a double layer system, are employed as the top imaging layer. In particular, the polysiloxane compositions of the present invention are exposed to ultraviolet light radiation and then developed. Being negative resist materials, that portion exposed to the ultraviolet light irradiation remains in place and acts as an etch mask for pattern transfer to the underlying planarizing polymer in a reactive ion etching oxygen plasma.

The double-layer system eliminates standing wave effects in resist which cause line with variation when resist is imaged over topographies of different reflectivities and refractive index. Also causing line width variation are differences in exposure dose caused by thickness variations when the planarizing resist layer is coated over topography. These thickness effects are minimized when imaging a uniform thin layer over a planarizing polymer.

Because the polysiloxane compositions are negative resists, the line width is independent of development time and no swelling has been observed, most likely because the film is relatively thin. Moreover, due to the flexibility of the polymeric backbone, the unexposed polysiloxanes have a tendency to "creep", affording excellent surface coverage. Accordingly, the coatings were substantially pin-hole free, only about 1 to 2 pin-holes per square centimeter.

The polysiloxane compositions of the present invention, after being coated to the desired thickness upon a substrate, are exposed to the deep ultraviolet light.

The unexposed portions are removed with a suitable solvent, depending upon the solubility characteristics of the specific polysiloxane composition employed.

Suitable solvents include alcohols, such as isopropanol and isoamyl alcohol; aromatic hydrocarbons, such as toluene and xylene; ketones, such as methylisobutyl ketone and cyclohexanone; esters, such as n-butyl acetate and isoamyl acetate; N-methyl pyrrolidone; freon; and 1,1,1 trichloroethylene.

The following non-limiting example is presented to further illustrate the present invention:

EXAMPLE 1

A composition containing about 10% by weight of a terpolymer of dimethyl-diphenyl vinyl polysiloxane having a molecular weight of about 790,000 and a dispersivity of about 3 (SE 54 from General Electric) and about 10% by weight based upon the polysiloxane of 2,2-dimethoxy-2-phenyl acetophenone (Irgacure 651) in isoamyl acetate is coated onto a hard baked (200° C.) diazo-sensitized phenol-formaldehyde novolak (AZ 1350J) which, in turn, was coated on a silicon substrate. The novolak layer is completely adsorbing to the imaging irradiation. The polysiloxane coating is exposed imagewise in a predetermined pattern to deep ultraviolet light irradiation. The film is then baked at about 125° C. for about 15 minutes and then developed in isoamyl acetate at about room temperature. The developing in the isoamyl acetate removes the unexposed portion of the polysiloxane film. The underlying novolak layer is then etched in an oxygen plasma at about 30 millitorr.

The polysiloxane compositions provide high resolution and increased sensitivity, as well as thermal stability.

Having thus described our invention, what we claim as new and desire to secure by Letters Patent is:

1. A process for producing an image which comprises providing on a substrate a layer of an ultraviolet light-sensitive negative resist composition consisting essentially of:
   (a) polysiloxane having polymerizable ethylenically unsaturated groups wherein said polysiloxane contains about 0.1% to about 20% by weight of ethylenically unsaturated groups per molecule and wherein said polysiloxane also contains phenyl or substituted phenyl groups, and
   (b) 2,2-dimethoxy-2-phenyl acetophenone in an amount sufficient to improve the sensitivity to ultraviolet light radiation, and being at least about 0.1% by weight based upon the polysiloxane.

imagewise exposing the layer of light-sensitive composition to imaging ultraviolet radiation in a desired pattern and developing the exposed layer, thereby leaving the desired pattern of the layer of light-sensitive negative resist composition remaining on the substrate, and then etching the substrate by a dry etching process using the pattern of the layer of light-sensitive negative resist composition as the mask.

2. The process of claim 1 wherein said composition is the top imaging layer in a double layer imaging process.

3. The process of claim 2 wherein the bottom layer in the double layer imaging process is etched using a dry etching process.

4. The process of claim 3 wherein said dry etching process is a reactive ion etching in oxygen plasma.

5. The process of claim 1 wherein said polysiloxane is a gum.

6. The process of claim 1 wherein said polysiloxane is a polydimethyl-diphenyl vinyl siloxane.

7. The process of claim 1 wherein said acetophenone is present in amounts of about 1% to about 20% by weight based upon the polysiloxane.

8. The process of claim 1 wherein said acetophenone is present in amounts of about 5% to 15% by weight based upon the polysiloxane.

9. The process of claim 1 wherein said polysiloxane contains about 0.1% to about 0.5% by weight of ethylenically unsaturated groups per molecule.

10. The process of claim 1 wherein said dry etching process is a reactive ion etching in oxygen plasma.

* * * * *

UNITED STATES PATENT AND TRADEMARK OFFICE
CERTIFICATE OF CORRECTION

PATENT NO. : 4,693,960

DATED : September 15, 1987

INVENTOR(S) : Babich, et al.

It is certified that error appears in the above-identified patent and that said Letters Patent is hereby corrected as shown below:

Column 8, line 6, after the word "polysiloxane" please delete the "." and insert therefor a -- ; --.

Signed and Sealed this

Sixteenth Day of February, 1988

Attest:

DONALD J. QUIGG

*Attesting Officer*     *Commissioner of Patents and Trademarks*